United States Patent [19]

Miyata et al.

[11] Patent Number: 5,351,145
[45] Date of Patent: Sep. 27, 1994

[54] ACTIVE MATRIX SUBSTRATE DEVICE AND RELATED METHOD

[75] Inventors: Yutaka Miyata, Ikoma; Mamoru Furuta, Osaka; Tatsuo Yoshioka, Osaka; Hiroshi Tsutsu, Osaka; Tetsuya Kawamura, Osaka, all of Japan

[73] Assignee: Matsushita Electric Industrial Co., Ltd., Osaka, Japan

[21] Appl. No.: 818,573

[22] Filed: Jan. 9, 1992

[30] Foreign Application Priority Data

Jan. 14, 1991 [JP] Japan .................................. 3-002640

[51] Int. Cl.⁵ ............................................. G02F 1/133
[52] U.S. Cl. ...................................... 359/57; 359/59; 359/85; 345/87
[58] Field of Search ..................... 359/55, 54, 59, 57, 359/85; 340/784

[56] References Cited

FOREIGN PATENT DOCUMENTS 0144297 12/1978 Japan .................................. 359/59
63-82177 4/1988 Japan .
0096636 4/1988 Japan .................................. 359/59
2178632 7/1990 Japan .

Primary Examiner—William L. Sikes
Assistant Examiner—Huy Mai
Attorney, Agent, or Firm—Lowe, Price, LeBlanc & Becker

[57] ABSTRACT

An active matrix substrate includes a transparent substrate, pairs each having an n-type thin-film transistor and a p-type thin-film transistor formed on the transparent substrate, gate bus lines and source bus lines connected to the n-type and p-type transistors for controlling the n-type and p-type transistors, and pixel-corresponding electrodes controlled by the transistor pairs respectively. Drains of an n-type transistor and a p-type transistor in each of the pairs are connected to each other via a related pixel corresponding electrode. First pulses are applied to gates of the n-type transistors. Second pulses are applied to gates of the p-type transistors. There is provided a difference in phase between the first pulses and the second pulses.

16 Claims, 12 Drawing Sheets

ACTIVE MATRIX SUBSTRATE DEVICE AND RELATED METHOD

BACKGROUND OF THE INVENTION

1. Field of the Invention

This invention relates to a liquid crystal display, an image sensor, or other devices using an active matrix substrate. This invention also relates to a method of driving an active matrix substrate, and a method of fabricating an active matrix substrate.

2. Description of the Prior Art

Japanese published unexamined patent application 63-82177 discloses a liquid crystal display apparatus using an active matrix substrate. The active matrix substrate has a matrix array of gate electrodes and source electrodes. Each of intersections of the gate electrodes and the source electrodes is provided with a pair of p-type and n-type thin-film transistors (TFTs) for controlling a liquid crystal display element corresponding to a pixel. In the display apparatus of Japanese patent application 63-82177, each pair of p-type and n-type TFTs are activated by drive signals having opposite polarities to prevent or reduce a drop in a drive voltage. In addition, off-timings of gate pulses applied to the p-type and n-type TFTs are made coincident to prevent the occurrence of noise induced via parasitic capacitances.

Japanese published unexamined patent application 2-178632 also discloses a liquid crystal display apparatus using an active matrix substrate. The active matrix substrate has a matrix array of gate electrodes and source electrodes. Each of intersections of the gate electrodes and the source electrodes is provided with a pair of p-type and n-type thin-film transistors (TFTs) for controlling a liquid crystal display element corresponding to a pixel. In the display apparatus of Japanese patent application 2-178632, drain electrodes of p-type and n-type TFTs in each pair are electrically connected to each other, and there are provided additional (supplemental) capacitors between the drain electrodes and the gate electrodes. In the display apparatus of Japanese patent application 2-178632, it is necessary to make coincident off-timings of gate pulses applied to the p-type and n-type TFTs.

SUMMARY OF THE INVENTION

It is a first object of this Invention to provide an improved device using an active matrix substrate.

It is a second object of this invention to provide an improved method of driving an active matrix substrate.

It is a third object of this invention to provide an improved method of fabricating an active matrix substrate.

A first aspect of this invention provides a method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of applying first pulses to gates of said n-type transistors; applying second pulses to gates of said p-type transistors; and providing a difference in phase between said first pulses and said second pulses.

A second aspect of this invention provides a method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of applying first pulses to gates of said n-type transistors; applying second pulses to gates of said p-type transistors; and providing a difference in pulse width between said first pulses and said second pulses.

A third aspect of this invention provides a method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of scanning said pixel-corresponding electrodes; and applying a gate voltage to a gate of one of an n-type transistor and a p-type transistor in each of said pairs before a horizontal scanning period for which a related pixel-corresponding electrode is scanned.

A fourth aspect of this invention provides a method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of applying first pulses to gates of said n-type transistors; applying second pulses to gates of said p-type transistors; and providing a difference in pulse height between said first pulses and said second pulses.

A fifth aspect of this invention provides a method of fabricating an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of forming n-type thin-film transistors and p-type thin-film transistors; and applying laser light to an intermediate substrate during said forming step.

A sixth aspect of this invention provides an apparatus comprising an active matrix substrate including pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair; means for feeding a first pulse to gates of n-type switching transistors in said pairs contained in a common row of the matrix in a given interval; means for feeding a second pulse to gates of p-type switching transistors in said pairs contained in said common row of the matrix in said given interval; and means for providing a difference in phase between the first pulse and the second pulse.

A seventh aspect of this invention provides an apparatus comprising an active matrix substrate having pairs each having an n-type switching transistor and a p-type switching transistor, and pixel-corresponding electrodes connected to said pairs respectively, wherein said pairs are arranged In a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair; means for feeding a first pulse to gates of n-type switching transistors in said pairs contained in a common row of the matrix in a given interval; means for feeding a second pulse to gates of p-type switching transistors in said pairs contained in said common row of the matrix in said given interval; and means for providing a difference in pulse width between the first pulse and the second pulse.

An eighth aspect of this invention provides an apparatus comprising an active matrix substrate having pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair; means for feeding a first pulse to gates of n-type switching transistors in said pairs contained in a common row of the matrix in a given interval; means for feeding a second pulse to gates of p-type switching transistors in said pairs contained in said common row of the matrix in said given interval; and means for providing a difference in pulse height between the first pulse and the second pulse.

DESCRIPTION OF THE BACKGROUND ART

Figure 1:
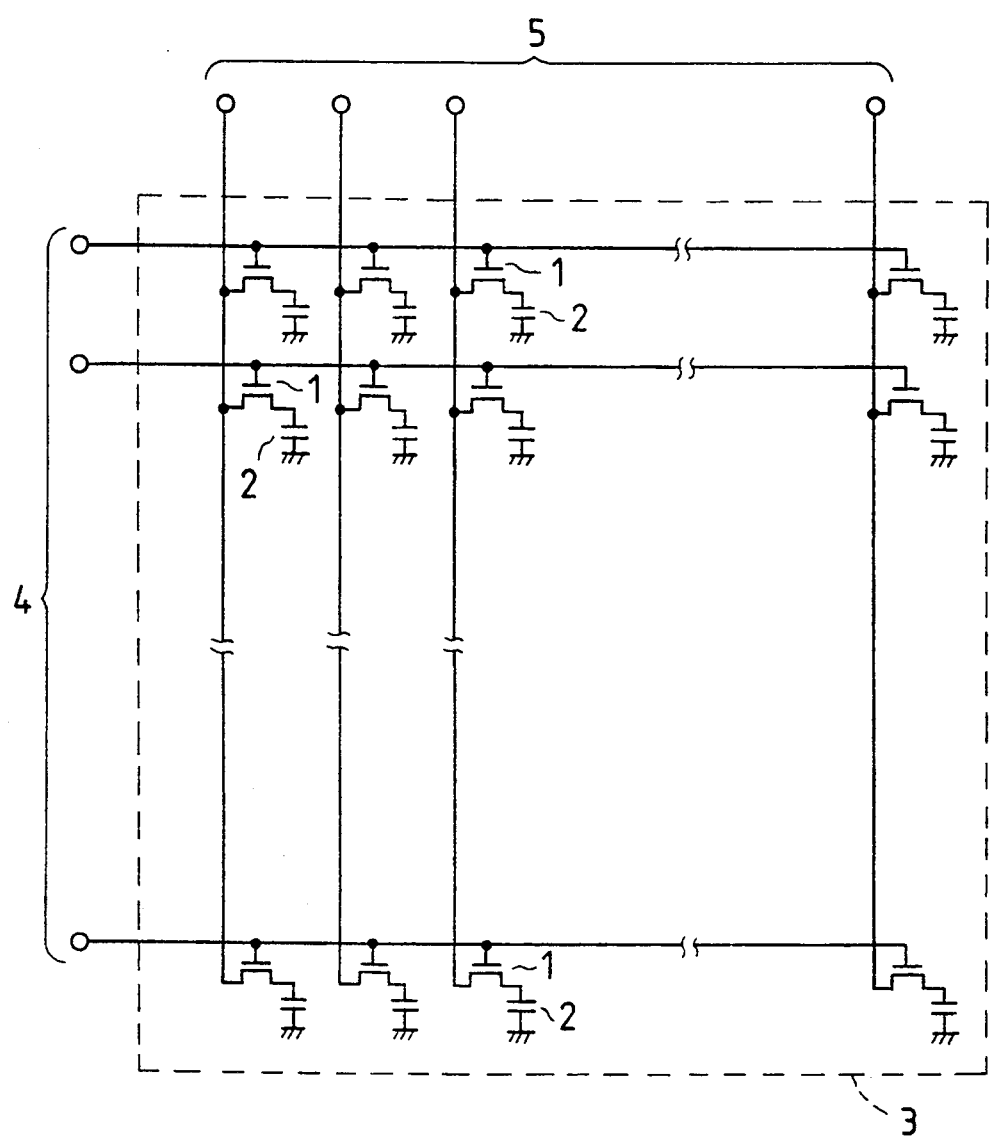
FIG. 1 is a schematic diagram of an equivalent circuit of a background-art active matrix substrate.

With reference to FIG. 1, an active matrix substrate in a liquid crystal display includes a second substrate or a transparent substrate, and a matrix array of thin-film transistors (TFTs) 1 formed on the transparent substrate. Liquid crystal display elements or cells 2 are arranged in a matrix. The display elements 2 are controlled by the TFTs 1 respectively. Each display cell 2 includes a given pixel-corresponding region of liquid crystal held between a transparent electrode and an opposed electrode. The transparent electrode is electrically connected to the drain of the related TFT 1. The opposed electrode extends on another transparent substrate forming a color filter. The display cells 2 correspond to pixels in an image indication region 3 respectively. In some cases, supplemental capacitors are provided on the active matrix substrate in addition to the capacitances related to the liquid crystal in the display cells 2.

The active matrix substrate is provided with a set of parallel gate wiring lines 4, and a set of parallel source wiring lines 5 perpendicular to the gate wiring lines 4. The gate wiring lines 4 correspond to rows of the matrix, while the source wiring lines 5 correspond to columns of the matrix. The gate electrodes of the TFTs 1 in a common row are electrically connected to corresponding one of the gate wiring lines 4. The source electrodes of the TFTs 1 in a common column are electrically connected to corresponding one of the source wiring lines 5.

Figure 2:
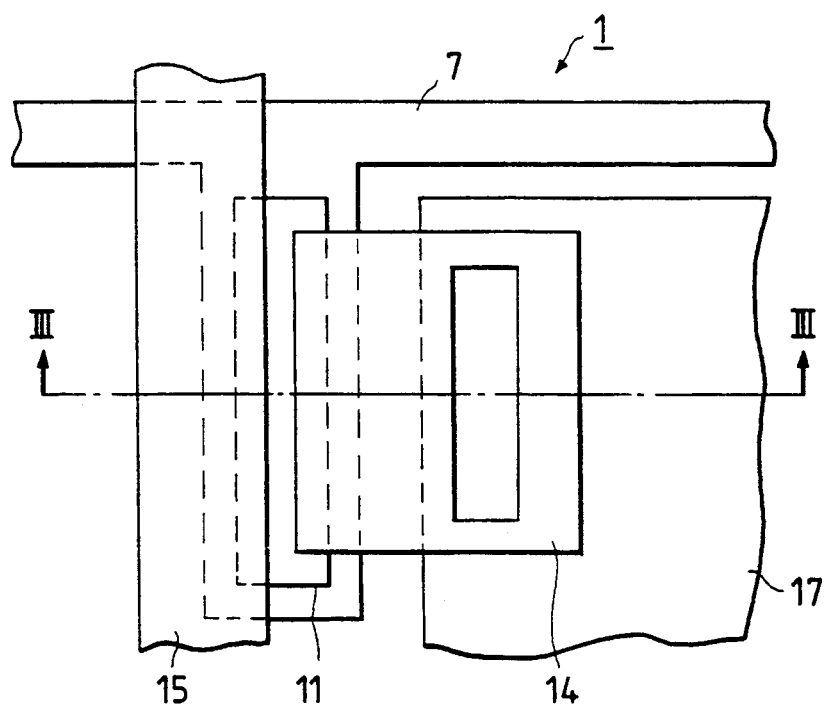
FIG. 2 is a plan view of a part of the active matrix substrate of FIG. 1.
Figure 3:
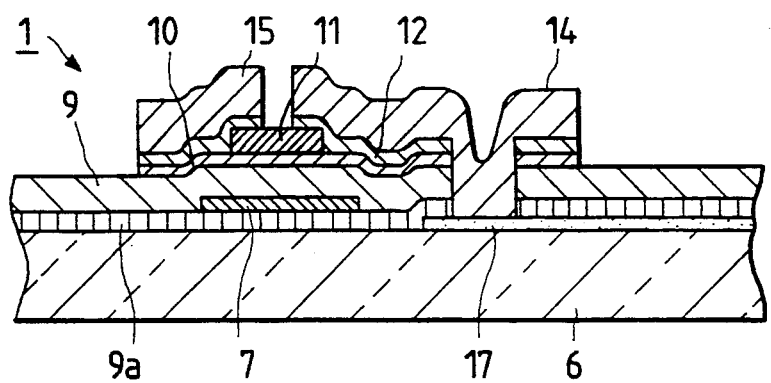
FIG. 3 is a sectional view of a part of the active matrix substrate taken along the line III—III of FIG. 2.

Each of the TFTs 1 in FIG. 1 has the following design. As shown in FIGS. 2 and 3, a TFT 1 formed on a glass substrate member (a transparent substrate member) 6 includes a gate electrode 7, a gate insulating layer 9, a semiconductor layer 10, an etching stopper layer 11, a drain electrode 14, and a source electrode 15. In addition, the TFT 1 includes an n+ semiconductor layer 12 which provides ohmic contacts among the semiconductor layer 10, the drain electrode 14, and the source electrode 15. A transparent electrode 17 extending on the glass substrate member 6 is electrically connected to the drain electrode 14. The transparent electrode 17 constitutes a pixel-corresponding electrode which enables the application of a voltage to a given pixel-corresponding region of a liquid crystal layer.

Figure 4:
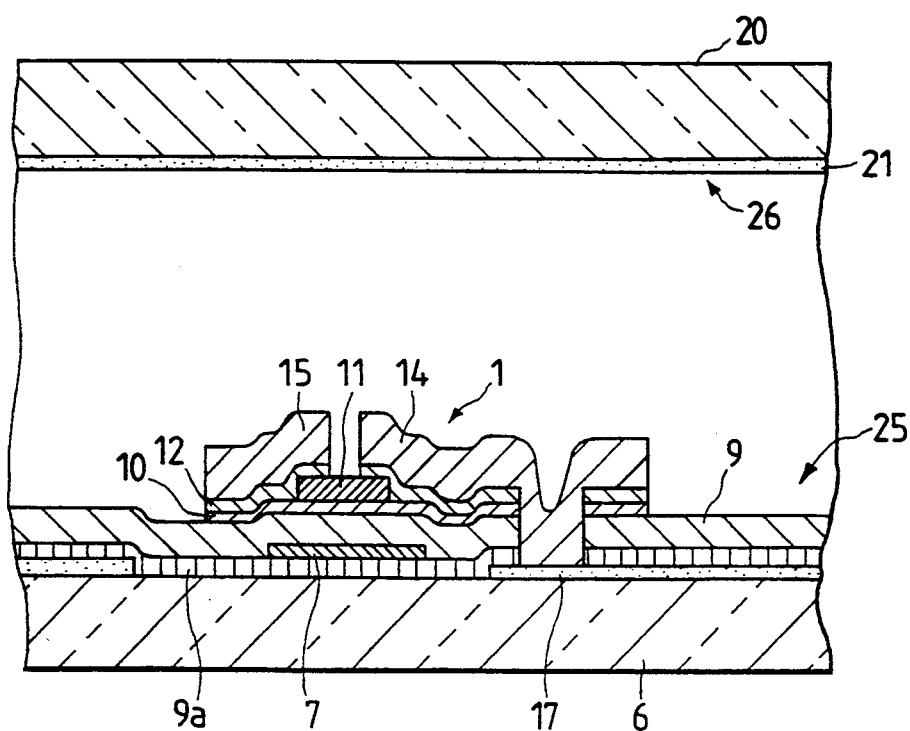
FIG. 4 is a sectional view of a part of a liquid crystal display using the active matrix substrate of FIGS. 1-3.

As shown in FIG. 4, the liquid crystal display includes the active matrix substrate 25 (see FIGS. 1–3), and another substrate 26 opposed to the substrate 25. The opposed substrate 26 includes a second substrate or a transparent substrate 20, and a transparent electrode 21 formed on the transparent substrate 20. The active matrix substrate 25 and the opposed substrate 26 are spaced by a given gap. The space between the active matrix substrate 25 and the opposite substrate 26 is filled with twist nematic (TN) liquid crystal. One surfaces of the two substrates 25 and 26 are provided with polarizers.

During the operation of the liquid crystal display, gate pulses are applied to the TFTs 1. In each of the TFTs 1, when a related gate pulse changes to an off state, this change is transmitted to the drain of the TFT via a gate-drain parasitic capacitance so that a drain electrode voltage is shifted or varied by a level $\Delta V$. The voltage shift level $\Delta V$ is given by the following equation.

$$\Delta V = \frac{C_P}{C_{ST} + C_P + C_{LC}} \cdot V_{P-P} \quad (1)$$

where $C_{LC}$ denotes the capacitance of a cell (a display element) corresponding to one pixel; $C_{ST}$ denotes the supplemental capacitance; $C_P$ denotes the parasitic capacitance of the TFT 1; and $V_{P-P}$ denotes the height (amplitude) of the gate voltage.

The voltage shift levels are always in a same direction (a minus direction), so that voltages applied to the display cells have DC offset components. Such DC offset components cause a degradation of the reliability of the liquid crystal display and a degradation of the quality.

DESCRIPTION OF THE FIRST PREFERRED EMBODIMENT

Figure 5:
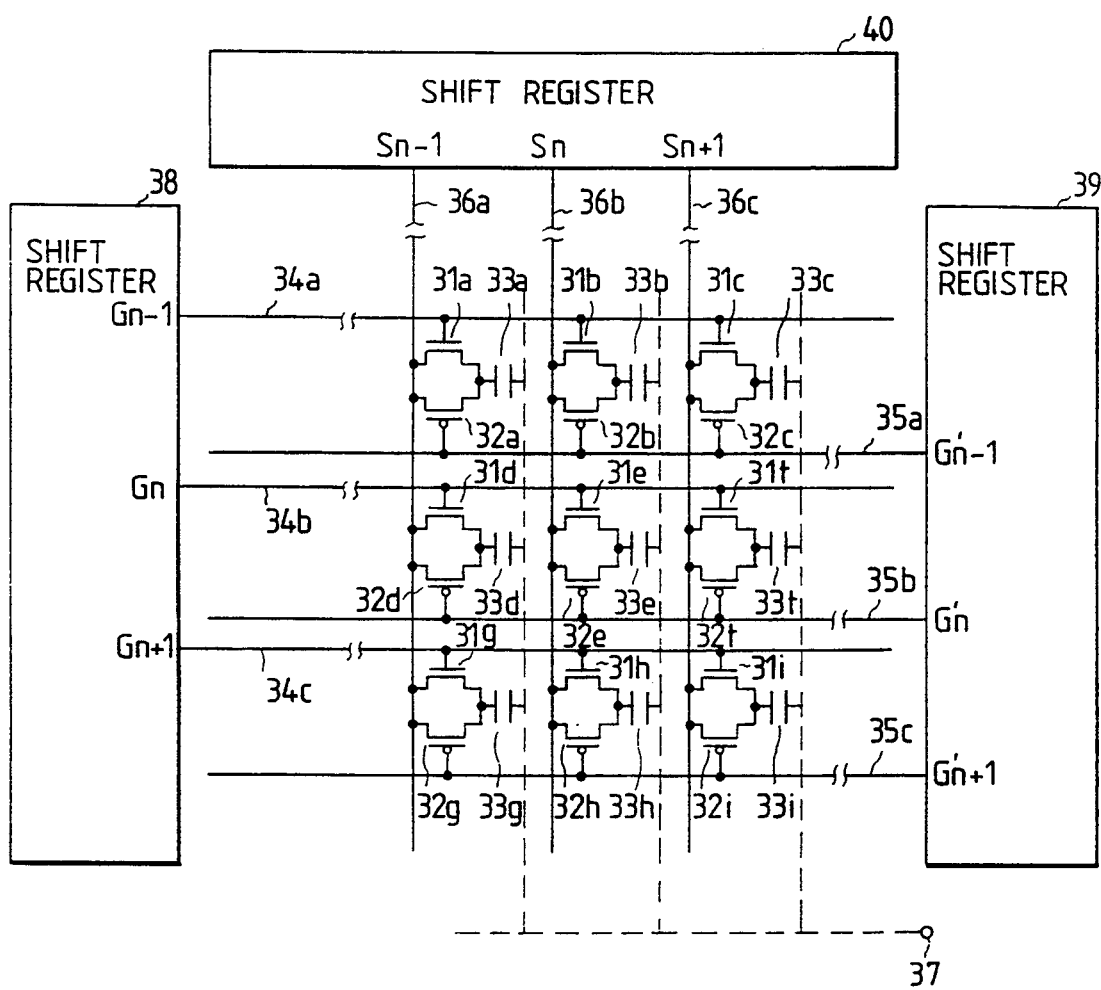
FIG. 5 is a schematic diagram of an equivalent circuit of an active matrix substrate and associated registers according to a first embodiment of this invention.

With reference to FIG. 5, an active matrix substrate in a liquid crystal display includes a second substrate or a transparent substrate, a matrix array of n-type thin-film transistors (TFTs) 31a–31i formed on the transparent substrate, and a matrix array of p-type thin-film transistors (TPTs) 32a–32i formed on the transparent substrate. The semiconductor layer of these TFTs are basically made of polycrystalline silicon or amorphous (non-crystalline) silicon. Liquid crystal display elements or cells 33a–33i are arranged in a matrix. The n-type TFTs 31a–31i, the p-type TFTs 32a–32i, and the cells 33a–33i are separated into groups which correspond to pixels respectively and which are arranged in a matrix. Specifically, each group has one n-type TFT, one p-type TFT, and one cell.

Each of the cells 33a–33i has a given pixel-corresponding region of liquid crystal held between a transparent electrode (a pixel-corresponding electrode) and an opposite electrode 37. The transparent electrode (the pixel-corresponding electrode) is connected to the drain electrodes of the related n-type TFT and the related p-type TFT. The opposite electrode 37 extends on an opposite substrate (not shown). In FIG. 5, the display cells 33a–33i are illustrated as capacitors. In fact, each of the display cells 33a–33i has a capacitance which depends on various factors such as the dielectric constant of the liquid crystal and the design of the related transparent electrode (the pixel-corresponding electrode).

It should be noted that the active matrix substrate may be formed with supplemental capacitors which provide capacitances in addition to the capacitances of the display cells 33a–33i.

A first set of gate bus lines 34a–34c, and a second set of gate bus lines 35a–35c correspond to rows of the matrix. A set of source bus lines 36a–36c correspond to columns of the matrix. The gate electrodes of the n-type TFTs in a common row are electrically connected to corresponding one of the gate bus lines 34a–34c. The gate electrodes of the p-type TFTs in a common row are electrically connected to corresponding one of the gate bus lines 35a–35c. The source electrodes of the n-type TFTs and the p-type TFTs in a common column are electrically connected to corresponding one of the source bus lines 36a–36c.

The gate bus lines 34a–34c electrically lead to a vertical shift register 38 which outputs gate pulse signals for the n-type TFTs. The gate bus lines 35a–35c electrically lead to another vertical shift register 39 which outputs gate pulse signals for the p-type TFTs. The source bus lines 36a–36c electrically lead to a horizontal shift register 40 which outputs image-information signals.

The operation of the liquid crystal display of FIG. 5 will now be described. For the simplicity, the following description relates mainly to the operation of a group of the n-type TFT 31a, the p-type TFT 32a, and the display cell 33a which is connected to the gate bus lines 34a and 35a, and the source bus line 36a.

During a 1-field interval, image-information signals which correspond to respective vertical segments of an image are fed from the horizontal shift register 40 to respective columns of the matrix. Each image-information signal sequentially represents pieces of image information which correspond to respective pixels in the related column of the matrix. During the 1-field interval, the vertical shift register 38 sequentially feeds gate pulses to rows of the matrix, and also the vertical shift register 39 sequentially feeds gate pulses to rows of the matrix. Pixels in one row of the matrix are scanned during the application of a single gate pulse from the vertical shift register 38 and the application of a single gate pulse from the vertical shift register 39.

In each group of an n-type TFT, a p-type TFT, and a display cell, when the n-type TFT and the p-type TFT receive gate pulses from the vertical shift registers 38 and 39, the n-type TFT and the p-type TFT become conductive so that the image information is transferred from the sources of the n-type TFT and the p-type TFT to the display cell. Thus, in each group, the n-type TFT and the p-type TFT serve as switches for selectively enabling and inhibiting the transmission of image information from the source side to the display cell, and the switches are closed and opened in response to signals fed to the gates of the n-type TFT and the p-type TFT.

Figure 6:
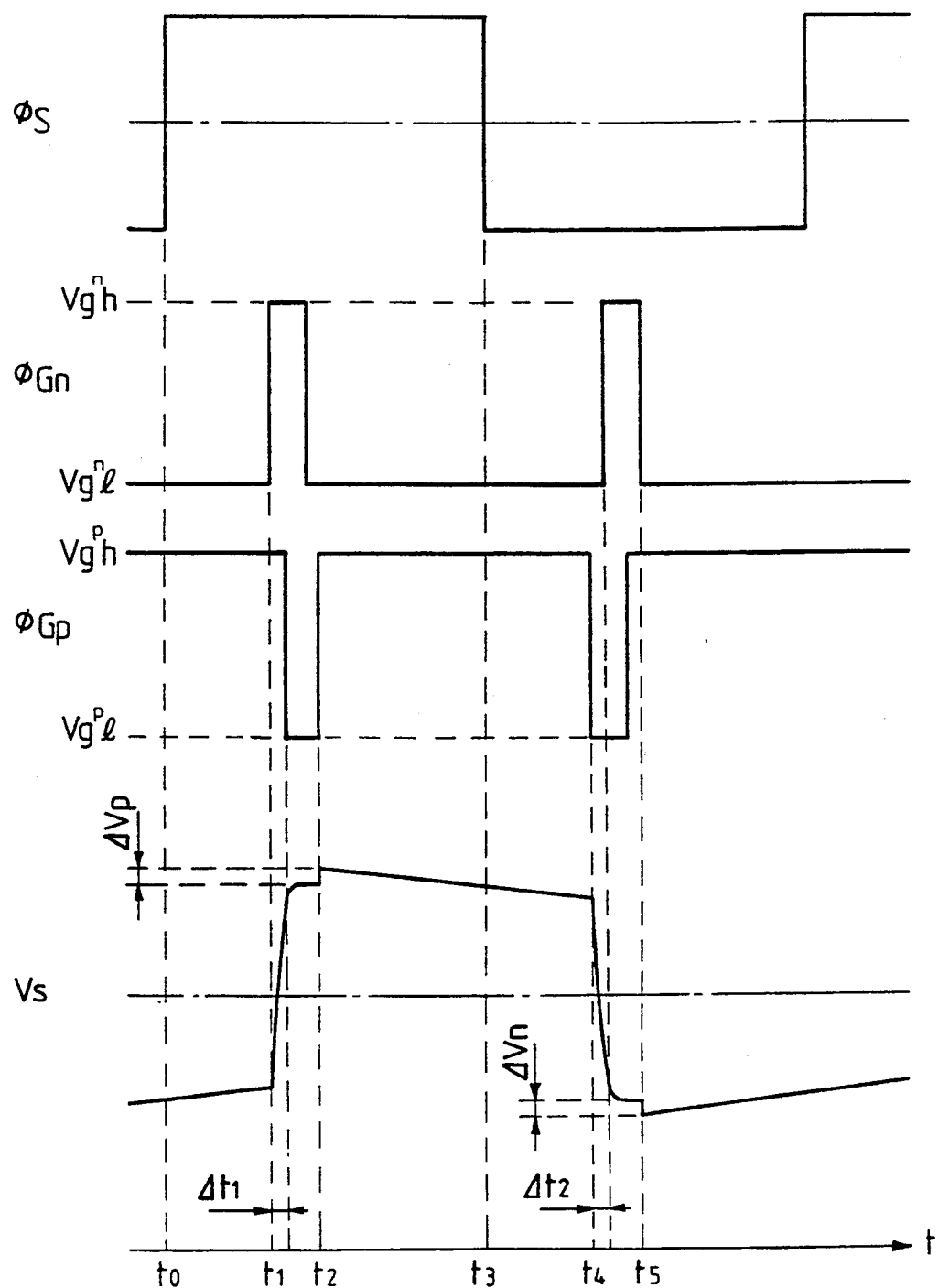
FIG. 6 is a time-domain diagram showing the waveforms of various signals in the circuit of FIG. 5.

It is now assumed that, as shown in FIG. 6, a source input signal $\phi s$ outputted from the horizontal shift register 40 changes in polarity from a negative state to a positive state at a moment $t_0$ and then remains at the positive state for a 1-field interval until a moment $t_3$, and the source input signal $\phi s$ changes in polarity from the positive state to the negative state at the moment $t_3$ and then remains at the negative state for a next 1-field interval. Such a source input signal φs corresponds to, for example, a vertically-extending black or white linear segment of an indicated image. During the period where the source input signal φs remains at the positive state, at a moment $t_1$ which follows the moment $t_0$, the n-type TFT 31a starts to be fed with a gate pulse φGn from the vertical shift register 38 so that the n-type TFT 31a becomes conductive and thus the related capacitor 33a starts to be charged by the source input signal φs. The gate pulse φGn lasts for a given interval. During the period where the source input signal φs remains at the positive state, at a moment which follows the moment $t_1$ by a given short interval $\Delta t_1$, the p-type TFT 32a starts to be fed with a gate pulse φGp from the vertical shift register 39 so that the p-type TFT 32a also becomes conductive and thus the related capacitor 33a is charged by the source input signal φs at a higher rate. Then, the gate pulse φGn terminates and subsequently the gate pulse φGp terminates. When the gate pulse φGn terminates, that is, when the voltage of the gate of the n-type TFT 31a drops from the higher level to the lower level, this gate voltage drop is undesirably transmitted to the drain of the n-type TFT 31a via the parasitic capacitance between the gate and the drain of the n-type TFT 31a so that the voltage of the drain of the n-type TFT 31a shifts in accordance with the gate voltage drop. Specifically, when the gate pulse φGn terminates, the voltage Vs at the drains of the n-type TFT 31a and the p-type TFT 32a (the voltage at the pixel-corresponding electrode) is subjected to a level change or shift ΔVn which is given as follows.

$$\Delta V_n = \frac{C_P}{C_{ST} + C_P + C_{LC}} \cdot (V_{gh}^n - V_{gl}^n) \quad (2)$$

where $C_{LC}$ denotes the capacitance of a display cell corresponding to one pixel; $C_{ST}$ denotes the supplemental capacitance; $C_P$ denotes the parasitic capacitance between the gate and the drain of the n-type TFT 31a; $V_{gh}^n$ denotes the higher level of the gate signal φGn; and $V_{gl}^n$ denotes the lower level of the gate signal φGn. At the moment of the termination of the gate pulse φGn, the gate pulse φGp remains present and thus the p-type TFT 32a continues to be conductive so that the capacitor 33a keeps charged. Thus, at the moment of the termination of the gate pulse φGn, the previously-mentioned level change ΔVn in the drain voltage Vs is suppressed or compensated During the subsequent period until the moment $t_2$ of the termination of the gate pulse φGp, the capacitor 33a is charged to the level of the source input signal φs. At the moment $t_2$ of the termination of the gate pulse φGp, the voltage of the gate of the p-type TFT 32a rises from the lower level to the higher level, this gate voltage rise is undesirably transmitted to the drain of the p-type TFT 32a via the parasitic capacitance between the gate and the drain of the p-type TFT 32a so that the voltage of the drain of the p-type TFT 32a shifts in accordance with the gate voltage rise. Specifically, at the moment $t_2$ of the termination of the gate pulse φGp, the voltage Vs at the drains of the n-type TFT 31a and the p-type TFT 32a (the voltage at the pixel-corresponding electrode) is subjected to a level change ΔVp which is given as follows.

$$\Delta V_p = -\frac{C_P}{C_{ST} + C_P + C_{LC}} \cdot (V_{gh}^p - V_{gl}^p) \quad (3)$$

where $C_{LC}$ denotes the capacitance of a display cell corresponding to one pixel; $C_{ST}$ denotes the supplemental capacitance; $C_P$ denotes the parasitic capacitance between the gate and the drain of the p-type TFT 32a; $V_{gh}^p$ denotes the higher level of the gate signal φGp; and $V_{gl}^p$ denotes the lower level of the gate signal φGp.

During the next 1-field interval which stats at the moment $t_3$, the source input signal φs remains at the negative state. During this 1-field interval, at a moment $t_4$ subsequent to the moment $t_3$, the p-type TFT 32a starts to be fed with a gate pulse φGp from the vertical shift register 39 so that the p-type TFT 32a becomes conductive and thus the related capacitor 33a starts to be charged (discharged) by the source input signal φs. The gate pulse φGp lasts for a given interval. During the period where the source input signal φs remains at the negative state, at a moment which follows the moment $t_4$ by a given short interval $\Delta t_2$, the n-type TFT 31a starts to be fed with a gate pulse φGn from the vertical shift register 38 so that the n-type TFT 31a also becomes conductive and thus the related capacitor 33a is charged (discharged) by the source input signal φs at a higher rate. Then, the gate pulse φGp terminates and subsequently the gate pulse φGn terminates. When the gate pulse φGp terminates, that is, when the voltage of the gate of the p-type TFT 32a rises from the lower level to the higher level, this gate voltage rise is undesirably transmitted to the drain of the p-type TFT 32a via the parasitic capacitance between the gate and the drain of the p-type TFT 32a so that the voltage of the drain of the p-type TFT 32a shifts in accordance with the gate voltage rise. Specifically, when the gate pulse φGp terminates, the voltage Vs at the drains of the n-type TFT 31a and the p-type TFT 32a (the voltage at the pixel-corresponding electrode) is subjected to a level change ΔVp which is expressed by the previous-mentioned equation (3). At the moment of the termination of the gate pulse φGp, the gate pulse φGn remains present and thus the n-type TFT 31a continues to be conductive so that the capacitor 33a keeps charged (discharged). Thus, at the moment of the termination of the gate pulse φGp, the previously-mentioned level change ΔVp in the drain voltage Vs is suppressed or compensated. During the subsequent period until the moment $t_5$ of the termination of the gate pulse φGn, the capacitor 33a is charged (discharged) to the level of the source input signal φs. At the moment $t_5$ of the termination of the gate pulse φGn, the voltage of the gate of the n-type TFT 31a drops from the higher level to the lower level, this gate voltage drop is undesirably transmitted to the drain of the n-type TFT 31a via the parasitic capacitance between the gate and the drain of the n-type TFT 31a so that the voltage of the drain of the n-type TFT 31a shifts in accordance with the gate voltage drop. Specifically, at the moment $t_5$ of the termination of the gate pulse φGn, the voltage Vs at the drains of the n-type TFT 31a and the p-type TFT 32a (the voltage at the pixel-corresponding electrode) is subjected to a level change ΔVn which is expressed by the previously-mentioned equation (2).

As shown in FIG. 6, the voltage shift ΔVp which occurs at the moment $t_2$ of the termination of the gate pulse φGp is opposite in direction (polarity) to the voltage shift ΔVn which occurs at the moment t₅ of the termination of the gate pulse φGn. Thus, the voltage shifts ΔVp and ΔVn are cancelled so that a DC offset component of the related drain voltage Vs can be reduced or removed in time average.

A DC offset component of the drain voltage Vs can be completely removed by equalizing the absolute values of the voltage shifts ΔVp and ΔVn. Equalizing the absolute values of the voltage shifts ΔVp and ΔVn is realized by suitably choosing the heights of the gate pulses φGn and φGp and the parasitic capacitances of the n-type and p-type TFT transistors 31a and 32a.

In cases where a given DC offset component is required to be added to the drain voltage Vs, a suitable choice of the heights of the gate pulses φGn and φGp can meet this requirement.

Figure 7:
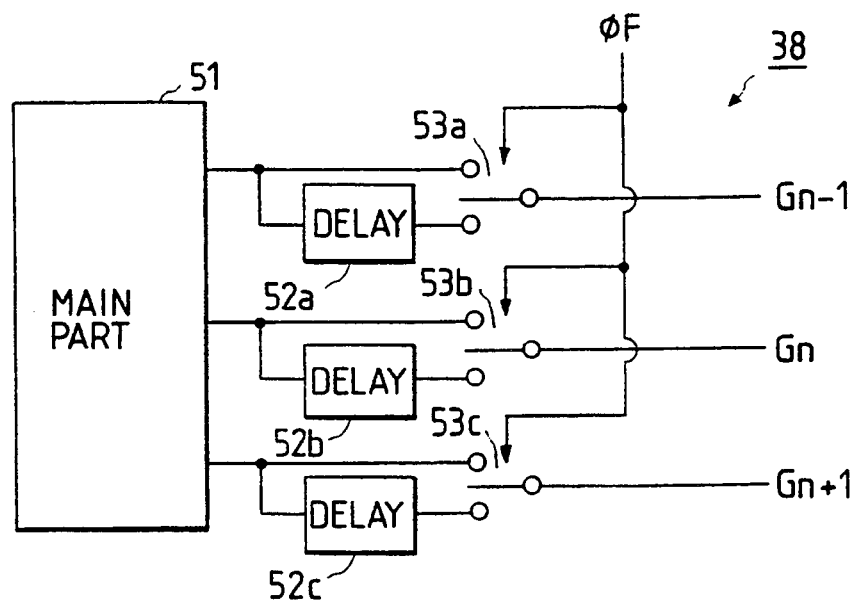
FIGS. 7 and 8 are block diagrams of the vertical shift registers in FIG. 5.

As shown in FIG. 7, the vertical shift register 38 includes a shift register main part 51, delay circuits 52a–52c, and switches 53a–53c. The shift register main part 51 outputs original gate pulses to the switches 53a–53c as non-delayed pulses respectively. The shift register main part 51 also outputs the original gate pulses to the delay circuits 52a–52c respectively. The delay circuits 52a–52c delay the original gate pulses by given times and thus output delayed pulses respectively. The delay circuits 52a–52c output the delayed pulses to the switches 53a–53c respectively. The switch 53a selects either the non-delayed pulse or the delayed pulse in response to a binary field signal φG which changes between a higher level and a lower level at a period corresponding to a field. For example, during a first 1-field interval, the switch 53a selects the non-delayed pulse and transmits the non-delayed pulse to the gate bus line 34a (see FIG. 5) as a gate pulse φGn. During a second 1-field interval, the switch 53a selects the delayed pulse and transmits the delayed pulse to the gate bus line 34a (see FIG. 5) as a gate pulse φGn. Similarly, the switch 53b selects either the non-delayed pulse or the delayed pulse in response to the binary field signal φF, and transmits the selected pulse to the gate bus line 34b (see FIG. 5). In addition, the switch 53c selects either the non-delayed pulse or the delayed pulse in response to the binary field signal φG, and transmits the selected pulse to the gate bus line 34c (see FIG. 5).

Figure 8:
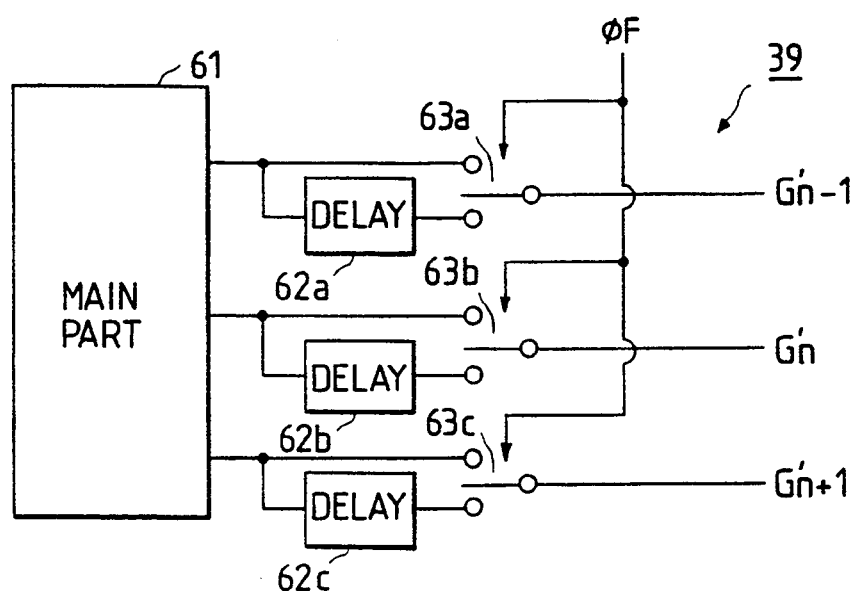

As shown in FIG. 8, the vertical shift register 39 includes a shift register main part 61, delay circuits 62a–62c, and switches 63a–63c. The shift register main part 61 outputs original gate pulses to the switches 63a–63c as non-delayed pulses respectively. The shift register main part 61 also outputs the original gate pulses to the delay circuits 62a–62c respectively. The delay circuits 62a–62c delay the original gate pulses by given times and thus output delayed pulses respectively. The delay circuits 62a–62c output the delayed pulses to the switches 63a–63c respectively. The switch 63a selects either the non-delayed pulse or the delayed pulse in response to the binary field signal φF. For example, during a first 1-field interval, the switch 63a selects the delayed pulse and transmits the delayed pulse to the gate bus line 35a (see FIG. 5) as a gate pulse φGp. During a second 1-field interval, the switch 63a selects the non-delayed pulse and transmits the non-delayed pulse to the gate bus line 35a (see FIG. 5) as a gate pulse φGp. Similarly, the switch 63b selects either the non-delayed pulse or the delayed pulse in response to the binary field signal φF, and transmits the selected pulse to the gate bus line 35b (see FIG. 5). In addition, the switch 63c selects either the non-delayed pulse or the delayed pulse in response to the binary field signal φF, and transmits the selected pulse to the gate bus line 35c (see FIG. 5).

Figure 13:
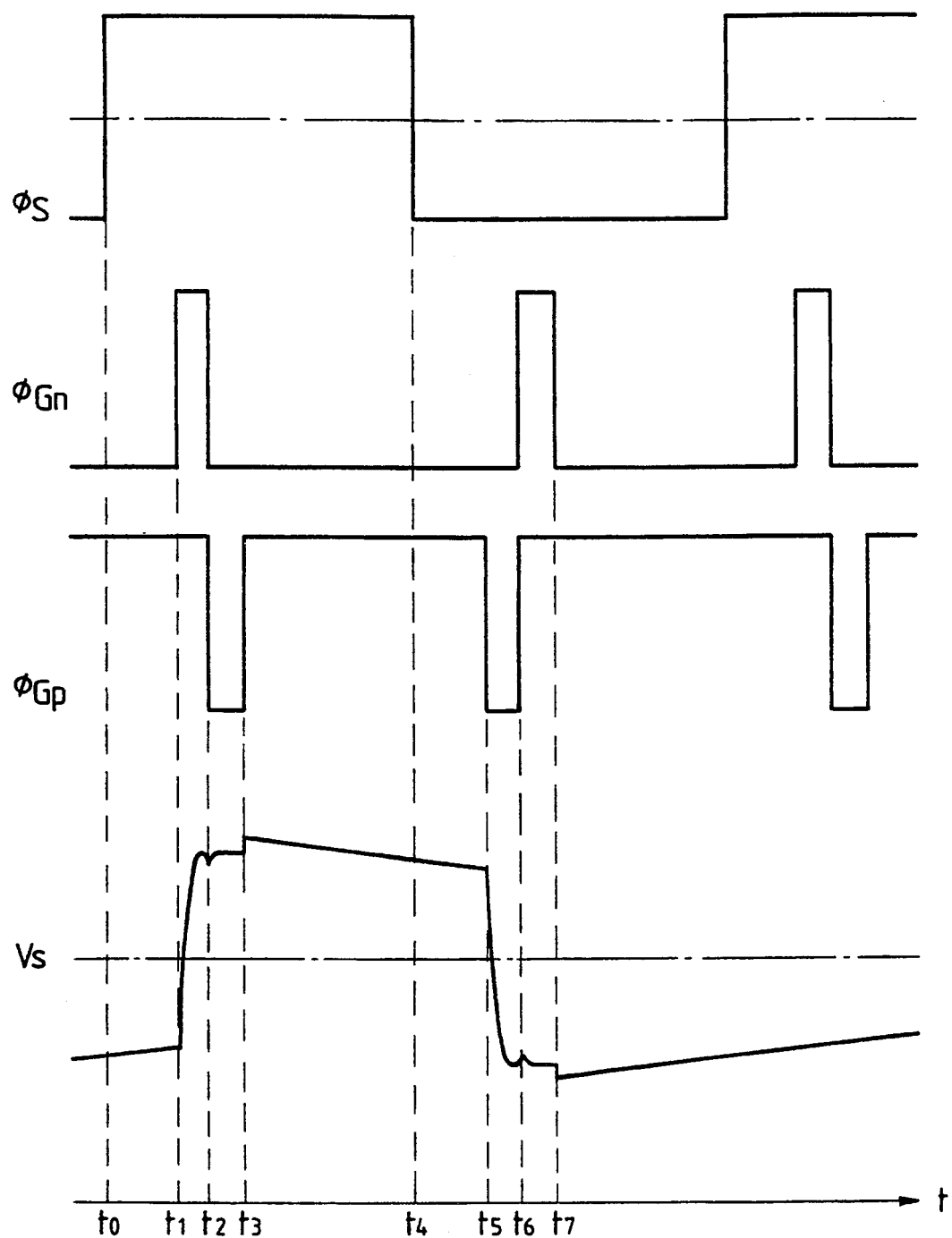
FIG. 13 is a time-domain diagram showing the waveforms of various signals in a modification of the circuit of FIG. 5.

It should be noted that gate pulses φGn and φGp may have a timing relation such as shown in FIG. 13. According to the timing relation of FIG. 13, during a first 1-field interval, at a moment t₁ preceding a 1-H period (a horizontal scanning period) for which the display cell 33a is scanned, the n-type TFT 31a starts to be fed with a gate pulse φGn. Before a moment t₂ which follows the 1-H period, the gate pulse φGn terminates. At the moment t₂, the p-type TFT 32a starts to be fed with a gate pulse φGp. At a moment t₃ following the moment t₂, the gate pulse φGp terminates. During a second 1-field interval, at a moment t₅ preceding a 1-H period (a horizontal scanning period) for which the display cell 33a is scanned, the p-type TFT 32a starts to be fed with a gate pulse φGp. Before a moment t₆ which follows the 1-H period, the gate pulse φGp terminates. At the moment t₆, the n-type TFT 31a starts to be fed with a gate pulse φGn. At a moment t₇ following the moment t₆, the gate pulse φGn terminates.

It should be noted that "field" may be replaced by "frame" or other given periods.

DESCRIPTION OF THE SECOND PREFERRED EMBODIMENT

Figure 9:
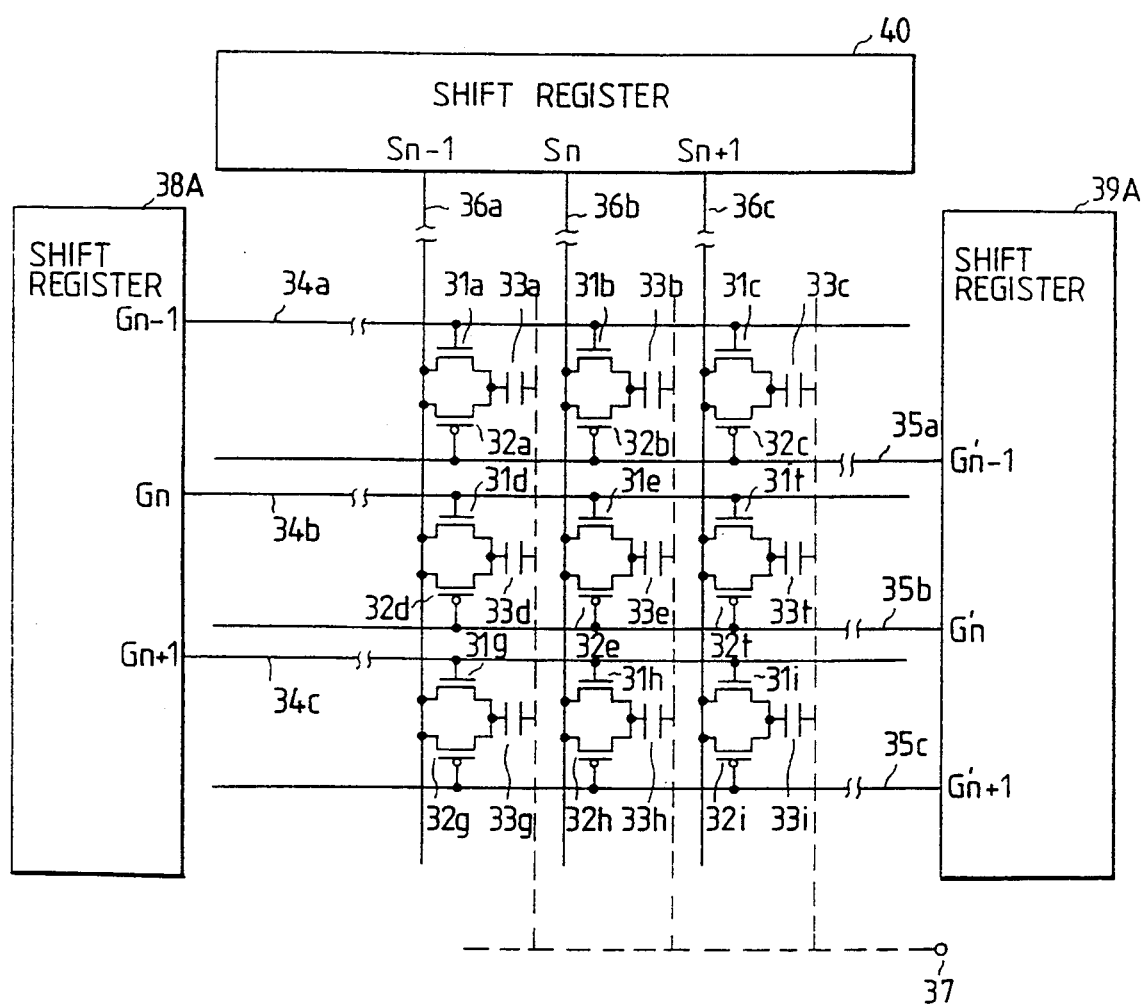
FIG. 9 is a schematic diagram of an equivalent circuit of an active matrix substrate and associated registers according to a second embodiment of this invention.

FIG. 9 shows a second embodiment of this invention which is similar to the embodiment of FIGS. 5–8 except for design changes indicated hereinafter. The embodiment of FIG. 9 has modified vertical shift registers 38A and 39A.

It is now assumed that, as shown in FIG. 6, a source input signal φs outputted from a horizontal shift register 40 changes in polarity from a negative state to a positive state at a moment t₀ and then remains at the positive state for a 1-field interval until a moment t₃, and the source input signal φs changes in polarity from the positive state to the negative state at the moment t₃ and then remains at the negative state for a next 1-field interval. Such a source input signal φs corresponds to, for example, a vertically-extending black or white linear segment of an indicated image. During the period where the source input signal φs remains at the positive state, at a moment t₁ which follows the moment t₀, an n-type TFT 31a and a p-type TFT 32a start to be fed with gate pulses Gn and φGp from the vertical shift registers 38A and 39A so that both the n-type TFT 31a and the p-type TFT 32a become conductive and thus a related capacitor 33a starts to be charged by the source input signal φs. The gate pulse φGn lasts for a given interval which is shorter than the duration of the gate pulse φGp. Thus, the gate pulse φGn terminates before the gate pulse φGp terminates. During the period where the source input signal φs remains at the positive state, the gate pulse φGn terminates and subsequently the gate pulse φGp terminates. When the gate pulse φGn terminates, that is, when the voltage of the gate of the n-type TFT 31a drops from the higher level to the lower level, this gate voltage drop is undesirably transmitted to the drain of the n-type TFT 31a via the parasitic capacitance between the gate and the drain of the n-type TFT 31a so that the voltage of the drain of the n-type TFT 31a shifts in accordance with the gate voltage drop. Specifically, when the gate pulse φGn terminates, the voltage Vs at the drains of the n-type TFT 31a and the p-type TFT 32a (the voltage at the pixel-corresponding electrode) is subjected to a level change or shift ΔVn which is expressed by the previously-mentioned equation (2). At the moment of the termination of the gate pulse φGn, the gate pulse φGp remains present and thus the p-type TFT 32a continues to be conductive so that the capacitor 33a keeps charged. Thus, at the moment of the termination of the gate pulse φGn, the previously-mentioned level change ΔVn in the drain voltage Vs is suppressed or compensated. During the subsequent period until the moment t₂ of the termination of the gate pulse φGp, the capacitor 33a is charged to the level of the source input signal φs. At the moment t₂ of the termination of the gate pulse φGp, the voltage of the gate of the p-type TFT 32a rises from the lower level to the higher level, this gate voltage rise is undesirably transmitted to the drain of the p-type TFT 32a via the parasitic capacitance between the gate and the drain of the p-type TFT 32a so that the voltage of the drain of the p-type TFT 32a shifts in accordance with the gate voltage rise. Specifically, at the moment t₂ of the termination of the gate pulse φGp, the voltage Vs at the drains of the n-type TFT 31a and the p-type TFT 32a ( the voltage at the pixel-corresponding electrode) is subjected to a level change ΔVp which is expressed by the previously-mentioned equation (3).

During the next 1-field period which starts at the moment t₃, the source input signal φs remains at the negative state. During this 1-field period, at a moment t₄ subsequent to the moment t₃, the n-type TFT 31a and the p-type TFT 32a start to be fed with gate pulses φGn and φGp from the vertical shift registers 38A and 39A so that both the n-type TFT 31a and the p-type TFT 32a become conductive and thus the related capacitor 33a starts to be charged (discharged) by the source input signal φs. The gate pulse φGn lasts for a given interval which is longer than the duration of the gate pulse φGp. Thus, the gate pulse φGn terminates after the gate pulse φGp terminates. During the period where the source input signal φs remains at the negative state, the gate pulse φGp terminates and subsequently the gate pulse φGn terminates. When the gate pulse φGp terminates, that is, when the voltage of the gate of the p-type TFT 32a rises from the lower level to the higher level, this gate voltage rise is undesirably transmitted to the drain of the p-type TFT 32a via the parasitic capacitance between the gate and the drain of the p-type TFT 32a so that the voltage of the drain of the p-type TFT 32a shifts in accordance with the gate voltage rise. Specifically, when the gate pulse φGp terminates, the voltage Vs at the drains of the n-type TFT 31a and the p-type TFT 32a (the voltage at the pixel-corresponding electrode) is subjected to a level change ΔVp which is expressed by the previous-mentioned equation (3). At the moment of the termination of the gate pulse φGp, the gate pulse φGn remains present and thus the n-type TFT 31a continues to be conductive so that the capacitor 33a keeps charged (discharged). Thus, at the moment of the termination of the gate pulse φGp, the previously-mentioned level change ΔVp in the drain voltage Vs is suppressed or compensated. During the subsequent period until the moment t₅ of the termination of the gate pulse φGn, the capacitor 33a is charged (discharged) to the level of the source input signal φs. At the moment t₅ of the termination of the gate pulse φGn, the voltage of the gate of the n-type TFT 31a drops from the higher level to the lower level, this gate voltage drop is undesirably transmitted to the drain of the n-type TFT 31a via the parasitic capacitance between the gate and the drain of the n-type TFT 31a so that the voltage of the drain of the n-type TFT 31a shifts in accordance with the gate voltage drop. Specifically, at the moment t₅ of the termination of the gate pulse φGn, the voltage Vs at the drains of the n-type TFT 31a and the p-type TFT 32a (the voltage at the pixel-corresponding electrode) is subjected to a level change ΔVn which is expressed by the previously-mentioned equation (2).

Figure 10:
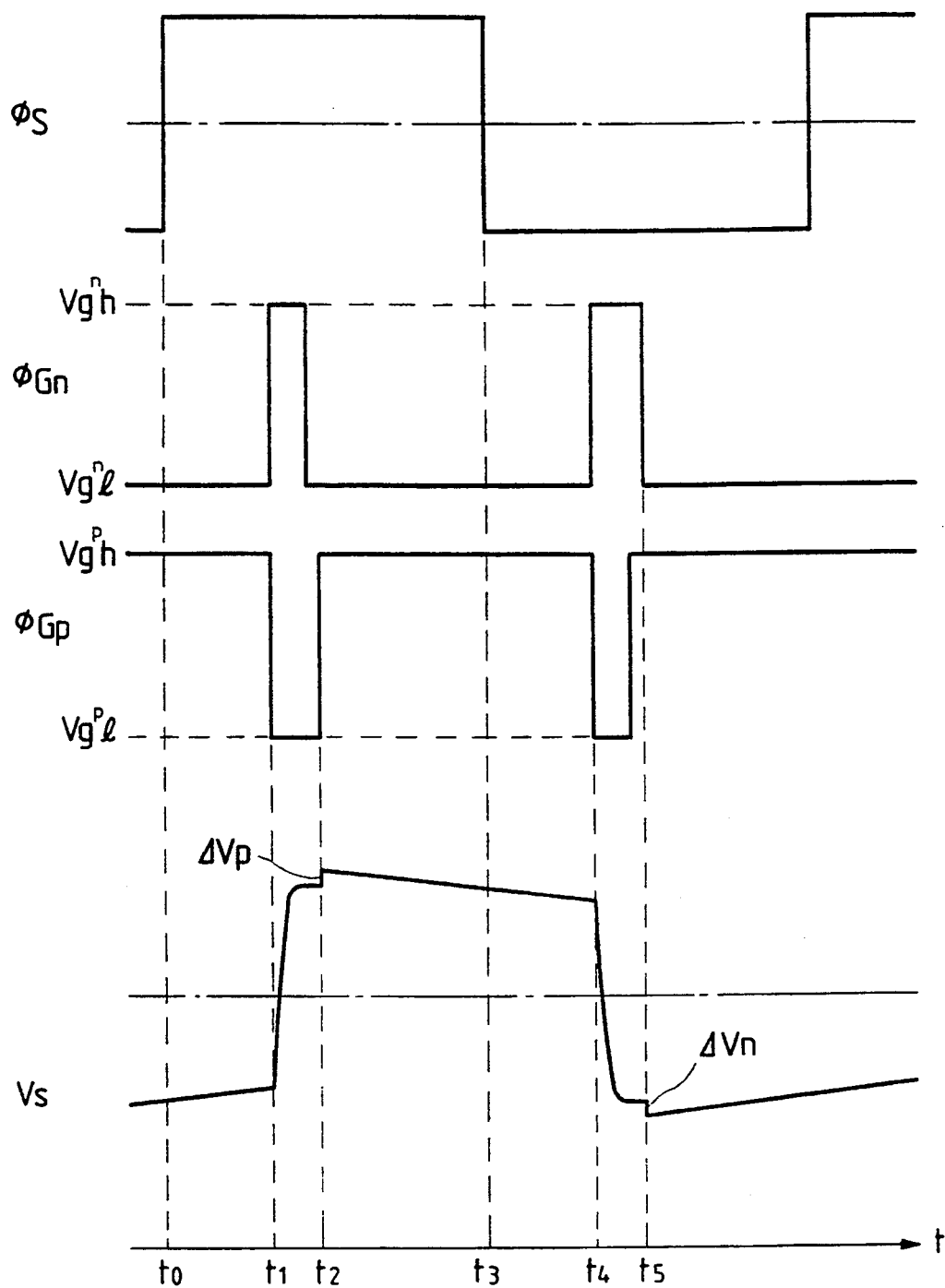
FIG. 10 is a time-domain diagram showing the waveforms of various signals in the circuit of FIG. 9.

As shown in FIG. 10, the voltage shift ΔVp which occurs at the moment t₂ of the termination of the gate pulse φGp is opposite in direction (polarity) to the voltage shift ΔVn which occurs at the moment t₅ of the termination of the gate pulse φGn. Thus, the voltage shifts ΔVp and ΔVn are cancelled so that a DC offset component of the related drain voltage Vs can be reduced or removed in time average.

A DC offset component of the drain voltage Vs can be completely removed by equalizing the absolute values of the voltage shifts ΔVp and ΔVn. Equalizing the absolute values of the voltage shifts ΔVp and ΔVn is realized by suitably choosing the heights of the gate pulses φGn and φGp and the parasitic capacitances of the n-type and p-type TFT transistors 31a and 32a.

In cases where a given DC offset component is required to be added to the drain voltage Vs, a suitable choice of the heights of the gate pulses φGn and φGp can meet this requirement.

Figure 11:
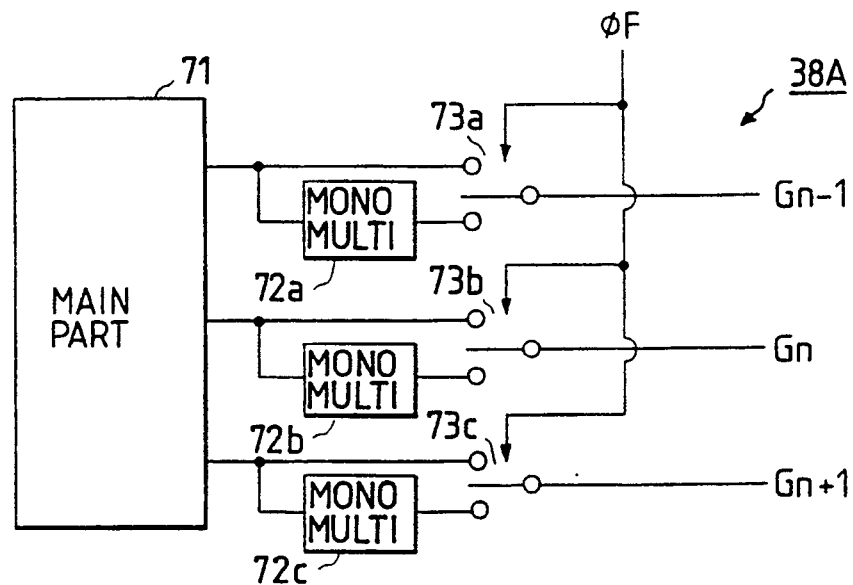
FIGS. 11 and 12 are block diagrams of the vertical shift registers in FIG. 9.

As shown in FIG. 11, the vertical shift register 38A includes a shift register main part 71, monostable multivibrators 72a–72c, and switches 73a–73c. The shift register main part 71 outputs original gate pulses to the switches 73a–73c as shorter pulses respectively. The shift register main part 71 also outputs the original gate pulses to the monostable multivibrators 72a–72c respectively. The monostable multivibrators 72a–72c lengthen the original gate pulses by given times and thus output longer pulses respectively. The monostable multivibrators 72a–72c output the longer pulses to the switches 73a–73c respectively. The switch 73a selects either the shorter pulse or the longer pulse in response to a binary field signal φF which changes between a higher level and a lower level at a period corresponding to a field. For example, during a first 1-field interval, the switch 73a selects the shorter pulse and transmits the shorter pulse to a gate bus line 34a (see FIG. 9) as a gate pulse φGn. During a second 1-field interval, the switch 73a selects the longer pulse and transmits the longer pulse to the gate bus line 34a (see FIG. 9) as a gate pulse φGn. Similarly, the switch 73b selects either the shorter pulse or the longer pulse in response to the binary field signal φF, and transmits the selected pulse to a gate bus line 34b (see FIG. 9). In addition, the switch 73c selects either the shorter pulse or the longer pulse in response to the binary field signal φF, and transmits the selected pulse to a gate bus line 34c (see FIG. 9).

Figure 12:
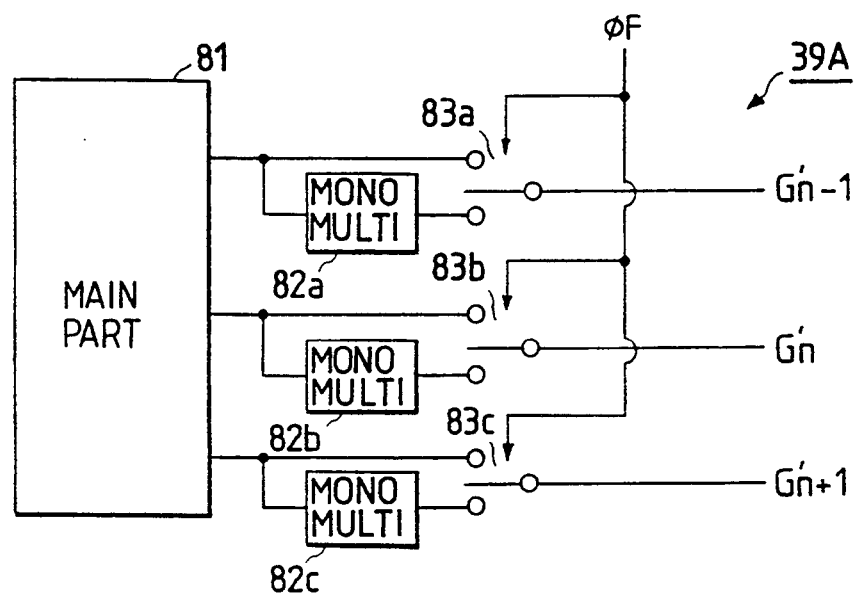

As shown in FIG. 12, the vertical shift register 39A includes a shift register main part 81, monostable multivibrators 82a–82c, and switches 83a–83c. The shift register main part 81 outputs original gate pulses to the switches 83a–83c as shorter pulses respectively. The shift register main part 81 also outputs the original gate pulses to the monostable multivibrators 82a–82c respectively. The monostable multivibrators 82a–82c lengthen the original gate pulses by given times and thus output longer pulses respectively. The monostable multivibrators 82a–82c output the longer pulses to the switches 83a–83c respectively. The switch 83a selects either the shorter pulse or the longer pulse in response to the binary field signal φF. For example, during a first 1-field interval, the switch 83a selects the longer pulse and transmits the longer pulse to a gate bus line 35a (see FIG. 9) as a gate pulse φGp. During a second 1-field interval, the switch 83a selects the shorter pulse and transmits the shorter pulse to the gate bus line 35a (see FIG. 9) as a gate pulse φGp. Similarly, the switch 83b selects either the shorter pulse or the longer pulse in response to the binary field signal φF, and transmits the selected pulse to a gate bus line 35b (see FIG. 9). In addition, the switch 83c selects either the shorter pulse or the longer pulse in response to the binary field signal φG, and transmits the selected pulse to a gate bus line 35c (see FIG. 9).

DESCRIPTION OF THE THIRD PREFERRED EMBODIMENT

Figure 14:
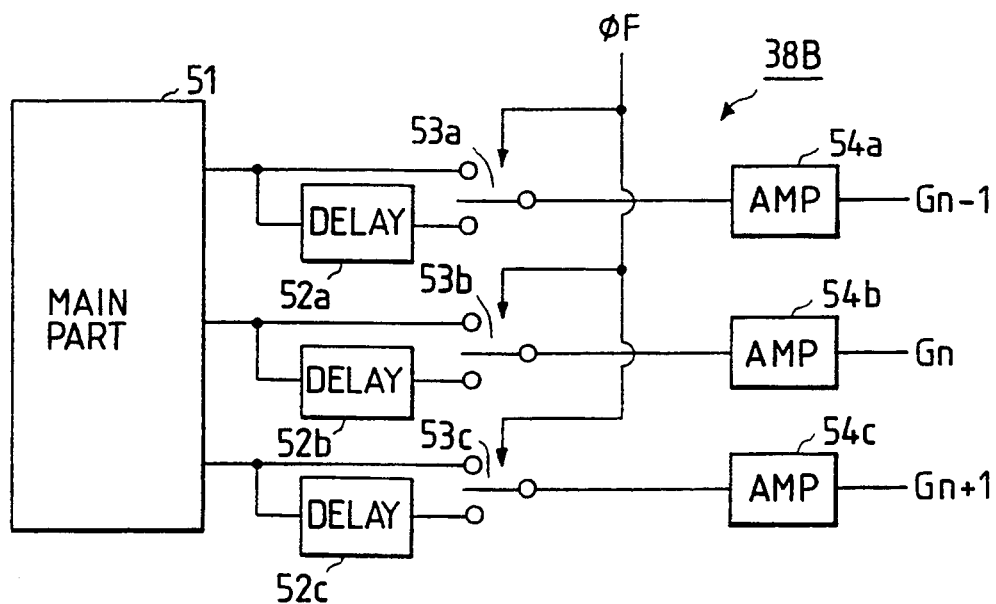
FIGS. 14 and 15 are block diagrams of vertical shift registers in a circuit according to a third embodiment of this invention.
Figure 15:
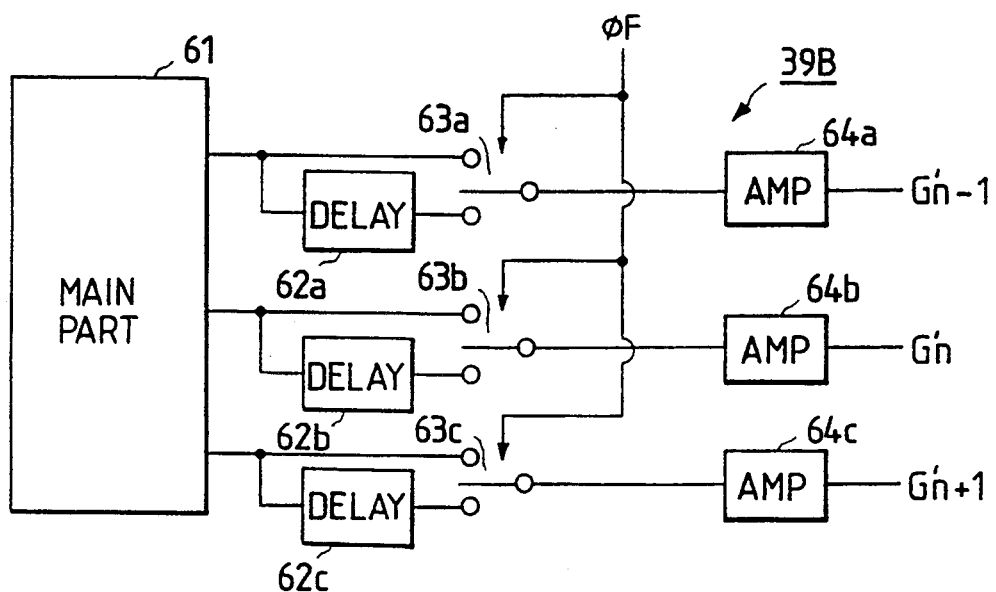

FIGS. 14 and 15 relate-to a third embodiment of this invention which is similar to the embodiment of FIGS. 5–8 except for design changes indicated hereinafter. The embodiment of FIGS. 14 and 15 has modified vertical shift registers 38B and 39B.

As shown in FIG. 14, the vertical shift register 38B includes amplifiers 54a–54c which follow switches 53a–53c respectively. The amplifiers 54a–54c output gate pulses φGn to gate bus lines 34a–34c (see FIG. 5) respectively.

As shown in FIG. 15, the vertical shift register 39B includes amplifiers 64a–64c which follow switches 63a–63c respectively. The amplifiers 64a–64c output gate pulses φGp to gate bus lines 35a–35c (see FIG. 5) respectively.

The gains of the amplifiers 54a–54c are different from the gains of the amplifiers 64a–64c so that the height of the gate pulses φGn is different from the height of the gate pulses φGp.

DESCRIPTION OF THE FOURTH PREFERRED EMBODIMENT

A fourth embodiment of this invention relates to a method of fabricating an active matrix substrate of the embodiments of FIGS. 5–15. The fourth embodiment will now be explained with reference to FIGS. 16(a) to 16(i).

Figure 16A:
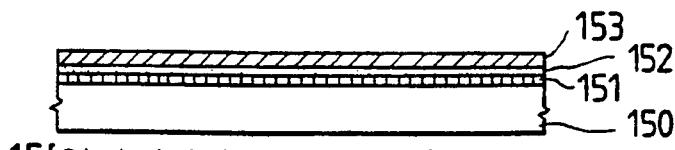
FIGS. 16($a$)-16($i$) are sectional views of a substrate in various states which occur during fabrication based on a fourth embodiment of this invention.
Figure 16B:
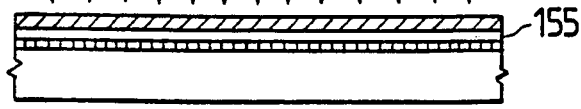

A transparent substrate 150 made of quartz or Coming #7059 was prepared. As shown in FIG. 16(a), a buffer layer 15 1 was formed on the transparent substrate 150. The buffer layer 151 was made of silicon dioxide or silicon nitride. An amorphous (non-crystalline) silicon layer 152 and a dielectric film 153 were successively formed on the buffer layer 151 by a plasma CVD method. The dielectric film 151 was made of silicon oxide, silicon nitride, a mixture of silicon oxide and silicon nitride, or another metal oxide. Then, as shown in FIG. 16(b), the substrate was subjected to a given process 154 so that the amorphous silicon layer 152 changed to a polycrystalline silicon layer 155. The given process included a heating process, an energy beam process, or a composite process having both a heating process and an energy beam process. For example, during the heating process, the substrate was located in a vacuum or in an inert gas, and the substrate was heated by a resistor-based heating device or a lamp annealing device. The energy beam process was executed by using an argon ion laser or an excimer laser.

Figure 16C:
Figure 16D:
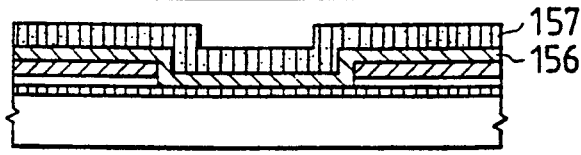
Figure 16E:
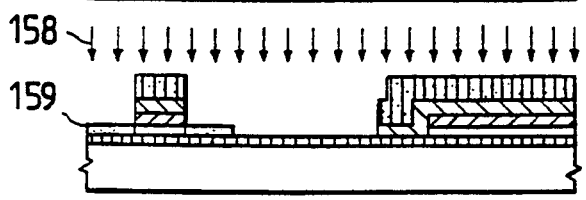
Figure 16F:
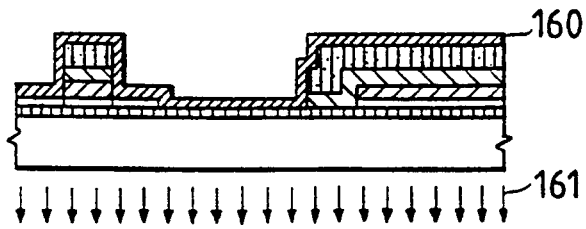

Subsequently, as shown in FIG. 16(c), given regions of the dielectric film 153 and the polycrystalline silicon layer 155 were removed from the substrate by a photo-graphic etching technique. Then, as shown in FIG. 16(d), a dielectric film 156 and an electrically-conductive layer 157 were formed on the substrate. The dielectric film 156 was made of silicon oxide or silicon nitride. The electrically-conductive layer 157 was made of a metal or an impurity-doped polycrystalline silicon. Given regions of the dielectric films 153 and 156 and the electrically-conductive layer 157 were removed from the substrate. Then, as shown in FIG. 16(e), impurity ions 158 were implanted into the substrate by an ion implantation apparatus or an ion shower apparatus, and an activating process was done so that n-type or p-type TFT source-drain regions 159 were formed.

Figure 16G:
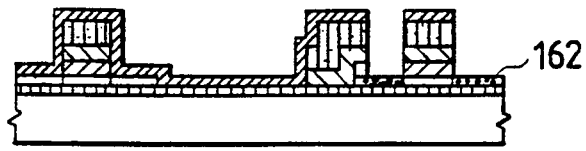

During the subsequent period, after an inter-layer insulating member 160 was formed on the substrate as shown in FIG. 16(t), given regions of the inter-layer insulating member 160, the electrically-conductive layer 157, and the dielectric films 153 and 156 were removed from the substrate. Then, as shown in FIG. 16(g), impurity ions 161 were implanted into the substrate by the ion implantation apparatus or the ion shower apparatus, and an activating process was done so that p-type or n-type TFT source-drain regions 162 were formed.

Figure 16H:
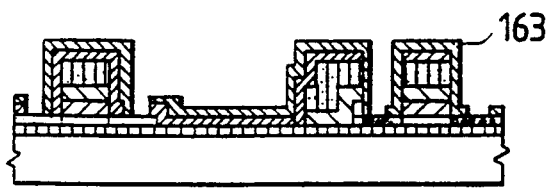
Figure 16I:
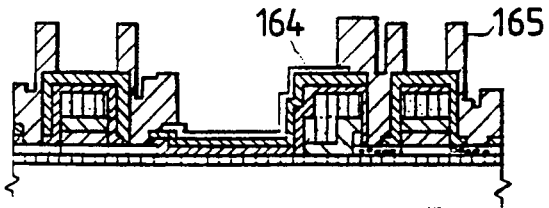

The impurity ions 158 were phosphor ions while the impurity ions 161 were boron ions. It may be good that the impurity ions 158 are boron ions while the impurity ions 16 1 are phosphor ions. Thus, there were formed pairs each having one n-type TFT and one p-type TFT. After an inter-layer insulating member 163 was formed on the substrate, given regions of the inter-layer insulating member 163 which extended above the source-drain regions of the TFTs were removed from the substrate as shown in FIG. 16(h). Then, as shown in FIG. 16(i), transparent electrically-conductive films 164 were formed on given regions of the substrate, and the source-drain regions of the TFTs were metalized by members 165 made of metal such as aluminum. The transparent electrically-conductive films 164 constituted pixel-corresponding electrodes. During the formation of the transparent electrically-conductive films 164 and the metalization of the source-drain regions of the TFTs, the drains of an n-type TFT and a p-type TFT in each pair were electrically connected via a related pixel-corresponding electrode 164. In this way, the active matrix substrate was fabricated.

What is claimed is:

1. A method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of:
    applying first pulses to gates of said n-type transistors in one field interval;
    applying second pulses to gates of said p-type transistors in said one field interval; and
    providing a difference in phase between said first pulses and said second pulses.

2. A method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor pairs respectively, wherein drains of an n-type transistor and a p-type transistor in each of said pairs are connected to each other via a related pixel corresponding electrode, the method comprising the steps of:

applying first pulses to gates of said n-type transistors;
applying second pulses to gates of said p-type transistors; and
providing a different in pulse width between said first pulses and said second pulses;
wherein a first pulse and a second pulse are respectively applied to gates of an n-type transistor and a p-type transistor in a pair related to a pixel-corresponding electrode during a selection of said pixel-corresponding electrode.

3. The method of claim 2, further comprising the steps of changing a pulse width of said first pulses every field, and changing a pulse width of said second pulses every field.

4. The method of claim 2, further comprising the steps of changing a pulse width of said first pulses every frame, and changing a pulse width of said second pulses every frame.

5. A method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of:

scanning said pixel-corresponding electrodes; and
applying a gate pulse to a gate of one of an n-type transistor and a p-type transistor in each of said pairs before a horizontal scanning period for which a related pixel-corresponding electrode is scanned.

6. A method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of:

applying first pulses to gates of said n-type transistors;
applying second pulses to gates of said p-type transistors; and
providing a difference in pulse height between said first pulses and said second pulses;
wherein a first pulse and a second pulse are respectively applied to gates of an n-type transistor and a p-type transistor in a pair related to a pixel-corresponding electrode during a selection of said pixel-corresponding electrode.

7. An apparatus comprising:

an active matrix substrate including pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel- corresponding electrode via the pair;
first feeding means for feeding a first pulse to gates of n-type switching transistors in said pairs contained in a common row of the matrix in one field interval;
second feeding means for feeding a second pulse to gates of p-type switching transistors in said pairs contained in said common row of the matrix in said one field interval; and
phase difference means for providing a difference in phase between the first pulse and the second pulse.

8. An apparatus comprising:

an active matrix substrate having pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair;
first means for feeding a first pulse to gates of n-type switching transistors in said pairs contained in a common row of the matrix in a given interval;
second means for feeding a second pulse to gates of p-type switching transistors in said pairs contained in said common row of the matrix in said given interval; and
means for providing a difference in pulse width between the first pulse and the second pulse;
wherein said first and second means include means for respectively applying a first pulse and a second pulse to gates of an n-type transistor and a p-type transistor in a pair related to a pixel-corresponding electrode during a selection of said pixel-corresponding electrode.

9. An apparatus comprising:

an active matrix substrate having pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair;
first means for feeding a first pulse to gates of n-type switching transistors in said pairs contained in a common row of the matrix in a given interval;

second means for feeding a second pulse to gates of p-type switching transistors in said pairs contained in said common row of the matrix in said given interval; and means for providing a different in pulse height between the first pulse and the second pulse;

wherein said first and second means include means for respectively applying a first pulse and a second pulse to gates of an n-type transistor and a p-type transistor in a pair related to a pixel-corresponding electrode during a selection of said pixel-corresponding electrode.

10. An apparatus comprising:

an active matrix substrate including pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair;

first feeding means for feeding a first pulse to gates of n-type switching transistors in said pairs contained in a common row of the matrix in a given interval;

second feeding means for feeding a second pulse to gates of p-type switching transistors in said pairs contained in said common row of the matrix in said given interval; and phase difference means for providing a difference in phase between the first pulse and the second pulse, wherein said first and second means include means for respectively applying both a first pulse and a second pulse to respective gates of an n-type transistor and a p-type transistor in a pair related to a pixel-corresponding electrode during access to said pixel-corresponding electrode.

11. A method of driving an active matrix substrate comprising a transparent substrate, pairs each having an n-type thin-film transistor and a p-type thin-film transistor formed on the transparent substrate, gate bus lines and source bus lines connected to said n-type and p-type transistors for controlling said n-type and p-type transistors, and pixel-corresponding electrodes controlled by said transistor pairs respectively, wherein drains of an n-type transistor and a p-type transistor in each of said pairs are connected to each other via a related pixel corresponding electrode, the method comprising the steps of:

applying first pulses to gates of said n-type transistors;

applying second pulses to gates of said p-type transistors; and providing a difference in phase between said first pulses and said second pulses, wherein said steps of applying said first and second pulses comprises respectively applying both a first pulse and a second pulse to gates of an n-type transistor and a p-type transistor in a pair related to a pixel-corresponding electrode during access to said pixel-corresponding electrode.

12. An apparatus comprising:

an active matrix substrate including pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair;

first means for applying a first sequence of pulses to gates of n-type switching transistors of said pairs contained in a common row of the matrix in one field interval;

second means for applying a second sequence of pulses to gates of p-type switching transistors in said pairs contained in said common row of the matrix in said one field interval; and timing means for providing a timing difference between the first and second sequences of pulses for reducing DC offset in pixel-corresponding electrodes connected to said pairs contained in said common row of the matrix.

13. An apparatus comprising:

an active matrix substrate including pairs each having an n-type switching transistor and a p-type switching transistor, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel-corresponding electrode via the pair;

first means for applying a first sequence of pulses to gates of n-type switching transistors of said pairs contained in a common row of the matrix in a given interval;

second means for applying a second sequence of pulses to gates of p-type switching transistors in said pairs contained in said common row of the matrix in said given interval; and timing means for providing a timing difference between the first and second sequences of pulses for reducing DC offset in pixel-corresponding electrodes connected to said pairs contained in said common row of the matrix, wherein said timing means comprises phase means for applying both said first and sequences of pulses to both said n-type and p-type transistors of a pair when a related pixel-corresponding electrode is being accessed and for causing alternate ones of said first sequence of pulses to precede corresponding ones of said second sequence of pulses applied to said pairs contained in said common row of the matrix, and for causing remaining ones of said first sequence of pulses to follow corresponding ones of said second sequence of pulses applied to said pairs contained in said common row of the matrix.

14. The apparatus recited in claim 13, wherein said phase means comprises delay means connected to said first and second means for providing delayed pulses respectively corresponding to and delayed from said first and second sequences of pulses, and switching means for selecting between said first and second sequences of pulses and said delayed pulses for application to corresponding n-type and p-type switching transistors of said pairs contained in said common row of the matrix.

15. An apparatus comprising:
an active matrix substrate including pairs each having an n-type switching transistor and a p-type switching transistors, and pixel-corresponding electrodes connected to said pairs respectively, wherein said pairs are arranged in a matrix, wherein each of said pixel-corresponding electrodes is connected to ends of source-drain paths of an n-type switching transistor and a p-type switching transistor in a related pair, and wherein when at least one of an n-type switching transistor and a p-type switching transistor in each of said pair is made conductive, an information signal can be transmitted to a related pixel- corresponding electrode via the pair;
first means for applying a first sequence of pulses to gates of n-type switching transistors of said pairs contained in a common row of the matrix in a given interval;
second means for applying a second sequence of pulses to gates of p-type switching transistors in said pairs contained in said common row of the matrix in said given interval; and
timing means for providing a timing difference between the first and second sequences of pulses for reducing DC offset in pixel-corresponding electrodes connected to said pairs contained in said common row of the matrix, wherein said timing means comprises pulse-width control means for applying both said first and sequences of pulses to both said n-type and p-type transistors of a pair when a related pixel-corresponding electrode is being accessed and for causing alternate ones of said first sequence of pulses to terminate before termination of corresponding ones of said second sequence of pulses applied to said pairs contained in said common row of the matrix, and for causing remaining ones of said first sequence of pulses to terminate after termination of corresponding ones of said second sequence of pulses applied to said pairs contained in said common row of the matrix.

16. The apparatus recited in claim 15, wherein said pulses-width control means comprises monostable multivibrator means connected to said first and second means for providing elongated pulses respectively corresponding to and having longer durations than said first and second sequences of pulses, and switching means for selecting between said first and sequences of pulses and said elongated pulses for application to corresponding n-type and p-type switching transistors of said pairs contained in said common row of the matrix.

* * * * *